(12) United States Patent
Bower et al.

(10) Patent No.: US 10,109,753 B2
(45) Date of Patent: Oct. 23, 2018

(54) COMPOUND MICRO-TRANSFER-PRINTED OPTICAL FILTER DEVICE

(71) Applicant: X-Celeprint Limited, Cork (IE)

(72) Inventors: Christopher Bower, Raleigh, NC (US); Ronald S. Cok, Rochester, NY (US)

(73) Assignee: X-Celeprint Limited, Cork (IE)

( * ) Notice: Subject to any disclaimer, the term of this patent is extended or adjusted under 35 U.S.C. 154(b) by 126 days.

(21) Appl. No.: 15/048,134

(22) Filed: Feb. 19, 2016

(65) Prior Publication Data

US 2017/0243988 A1   Aug. 24, 2017

(51) Int. Cl.
| | | |
|---|---|---|
| *H01L 31/02* | (2006.01) | |
| *H01L 31/0232* | (2014.01) | |
| *H01L 33/58* | (2010.01) | |

(52) U.S. Cl.
CPC .......... *H01L 31/0232* (2013.01); *H01L 33/58* (2013.01); *H01L 2933/0058* (2013.01)

(58) Field of Classification Search
CPC .................. H01L 31/0232; H01L 33/58; H01L 2933/0058
See application file for complete search history.

(56) References Cited

U.S. PATENT DOCUMENTS

| | | |
|---|---|---|
| 5,550,066 A | 8/1996 | Tang et al. |
| 5,621,555 A | 4/1997 | Park |
| 5,815,303 A | 9/1998 | Berlin |
| 5,994,722 A | 11/1999 | Averbeck et al. |
| 6,084,579 A | 7/2000 | Hirano |

(Continued)

FOREIGN PATENT DOCUMENTS

| | | |
|---|---|---|
| WO | WO-2006/027730 A1 | 3/2006 |
| WO | WO-2006/099741 A1 | 9/2006 |

(Continued)

OTHER PUBLICATIONS

Lee, S. H. etal, Laser Lift-Offof GaN Thin Film and its Application to the Flexible Light Emitting Diodes, Proc. of SPIE 8460:846011-1-846011-6 (2012).

(Continued)

*Primary Examiner* — Fernando L Toledo
*Assistant Examiner* — Neil Prasad
(74) *Attorney, Agent, or Firm* — William R. Haulbrook; Bin Li; Choate, Hall & Stewart LLP

(57) ABSTRACT

Embodiments of the present invention provide a compound optical filter device comprising a semiconductor substrate having an optical transducer formed on the semiconductor substrate, the optical transducer responsive to light to produce a signal or responsive to a signal to emit light. An optical filter comprises a filter substrate separate and independent from the semiconductor substrate and one or more optical filter layers disposed on the filter substrate. The filter substrate is micro-transfer printed on or over the semiconductor substrate or on layers formed over the semiconductor substrate and over the optical transducer to optically filter the light to which the optical transducer is responsive or to optically filter the light emitted by the optical transducer. In further embodiments, the optical filter is an interference filter and the semiconductor substrate includes active components that can control or operate the optical transducer.

20 Claims, 7 Drawing Sheets

(56) References Cited

U.S. PATENT DOCUMENTS

| | | |
|---|---|---|
| 6,142,358 A | 11/2000 | Cohn et al. |
| 6,169,294 B1 | 1/2001 | Biing-Jye et al. |
| 6,184,477 B1 | 2/2001 | Tanahashi |
| 6,278,242 B1 | 8/2001 | Cok et al. |
| 6,392,340 B2 | 5/2002 | Yoneda et al. |
| 6,466,281 B1 | 10/2002 | Huang et al. |
| 6,577,367 B2 | 6/2003 | Kim |
| 6,660,457 B1 | 12/2003 | Imai et al. |
| 6,703,780 B2 | 3/2004 | Shiang et al. |
| 6,717,560 B2 | 4/2004 | Cok et al. |
| 6,756,576 B1 | 6/2004 | McElroy et al. |
| 6,812,637 B2 | 11/2004 | Cok et al. |
| 6,828,724 B2 | 12/2004 | Burroughes |
| 6,933,532 B2 | 8/2005 | Arnold et al. |
| 7,012,382 B2 | 3/2006 | Cheang et al. |
| 7,091,523 B2 | 8/2006 | Cok et al. |
| 7,098,589 B2 | 8/2006 | Erchak et al. |
| 7,129,457 B2 | 10/2006 | McElroy et al. |
| 7,195,733 B2 | 3/2007 | Rogers et al. |
| 7,288,753 B2 | 10/2007 | Cok |
| 7,402,951 B2 | 7/2008 | Cok |
| 7,420,221 B2 | 9/2008 | Nagai |
| 7,466,075 B2 | 12/2008 | Cok et al. |
| 7,521,292 B2 | 4/2009 | Rogers et al. |
| 7,557,367 B2 | 7/2009 | Rogers et al. |
| 7,586,497 B2 | 9/2009 | Boroson et al. |
| 7,622,367 B1 | 11/2009 | Nuzzo et al. |
| 7,662,545 B2 | 2/2010 | Nuzzo et al. |
| 7,687,812 B2 | 3/2010 | Louwsma et al. |
| 7,704,684 B2 | 4/2010 | Rogers et al. |
| 7,791,271 B2 | 9/2010 | Cok et al. |
| 7,799,699 B2 | 9/2010 | Nuzzo et al. |
| 7,816,856 B2 | 10/2010 | Cok et al. |
| 7,834,541 B2 | 11/2010 | Cok |
| 7,893,612 B2 | 2/2011 | Cok |
| 7,919,342 B2 | 4/2011 | Cok |
| 7,927,976 B2 | 4/2011 | Menard |
| 7,932,123 B2 | 4/2011 | Rogers et al. |
| 7,943,491 B2 | 5/2011 | Nuzzo et al. |
| 7,969,085 B2 | 6/2011 | Cok |
| 7,972,875 B2 | 7/2011 | Rogers et al. |
| 7,982,296 B2 | 7/2011 | Nuzzo et al. |
| 7,990,058 B2 | 8/2011 | Cok et al. |
| 7,999,454 B2 | 8/2011 | Winters et al. |
| 8,029,139 B2 | 10/2011 | Ellinger et al. |
| 8,039,847 B2 | 10/2011 | Nuzzo et al. |
| 8,143,608 B2 | 3/2012 | Yao et al. |
| 8,198,621 B2 | 6/2012 | Rogers et al. |
| 8,207,547 B2 | 6/2012 | Lin |
| 8,243,027 B2 | 8/2012 | Hotelling et al. |
| 8,261,660 B2 | 9/2012 | Menard |
| 8,288,843 B2 | 10/2012 | Kojima et al. |
| 8,334,545 B2 | 12/2012 | Levermore et al. |
| 8,394,706 B2 | 3/2013 | Nuzzo et al. |
| 8,440,546 B2 | 5/2013 | Nuzzo et al. |
| 8,450,927 B2 | 5/2013 | Lenk et al. |
| 8,470,701 B2 | 6/2013 | Rogers et al. |
| 8,502,192 B2 | 8/2013 | Kwak et al. |
| 8,506,867 B2 | 8/2013 | Menard |
| 8,598,672 B2 | 12/2013 | Wang et al. |
| 8,624,341 B2 | 1/2014 | Holenarsipur et al. |
| 8,664,699 B2 | 3/2014 | Nuzzo et al. |
| 8,686,447 B2 | 4/2014 | Tomoda et al. |
| 8,722,458 B2 | 5/2014 | Rogers et al. |
| 8,735,932 B2 | 5/2014 | Kim et al. |
| 8,754,396 B2 | 6/2014 | Rogers et al. |
| 8,766,970 B2 | 7/2014 | Chien et al. |
| 8,791,474 B1 | 7/2014 | Bibl et al. |
| 8,794,501 B2 | 8/2014 | Bibl et al. |
| 8,803,068 B2 | 8/2014 | Kerness et al. |
| 8,803,857 B2 | 8/2014 | Cok |
| 8,817,369 B2 | 8/2014 | Daiku |
| 8,854,294 B2 | 10/2014 | Sakariya |
| 8,860,051 B2 | 10/2014 | Fellows et al. |
| 8,877,648 B2 | 11/2014 | Bower et al. |
| 8,884,844 B2 | 11/2014 | Yang et al. |
| 8,889,485 B2 | 11/2014 | Bower |
| 8,895,406 B2 | 11/2014 | Rogers et al. |
| 8,902,152 B2 | 12/2014 | Bai et al. |
| 8,946,760 B2 | 2/2015 | Kim |
| 8,987,765 B2 | 3/2015 | Bibl et al. |
| 9,202,996 B2 | 12/2015 | Orsley et al. |
| 2001/0022564 A1 | 9/2001 | Youngquist et al. |
| 2002/0096994 A1 | 7/2002 | Iwafuchi et al. |
| 2003/0094665 A1* | 5/2003 | Harazono ......... H01L 27/14618 257/432 |
| 2004/0212296 A1 | 10/2004 | Nakamura et al. |
| 2004/0227704 A1 | 11/2004 | Wang et al. |
| 2004/0252933 A1 | 12/2004 | Sylvester et al. |
| 2005/0006657 A1 | 1/2005 | Terashita |
| 2005/0012076 A1 | 1/2005 | Morioka |
| 2005/0116621 A1 | 6/2005 | Bellmann et al. |
| 2005/0140275 A1 | 6/2005 | Park |
| 2005/0168987 A1 | 8/2005 | Tamaoki et al. |
| 2005/0275615 A1 | 12/2005 | Kahen et al. |
| 2006/0063309 A1 | 3/2006 | Sugiyama et al. |
| 2007/0035340 A1 | 2/2007 | Kimura |
| 2007/0077349 A1 | 4/2007 | Newman et al. |
| 2007/0201056 A1 | 8/2007 | Cok et al. |
| 2008/0211734 A1 | 9/2008 | Huitema et al. |
| 2009/0315054 A1 | 12/2009 | Kim et al. |
| 2010/0078670 A1 | 4/2010 | Kim et al. |
| 2010/0123268 A1 | 5/2010 | Menard |
| 2010/0148198 A1 | 6/2010 | Sugizaki et al. |
| 2010/0214247 A1 | 8/2010 | Tang et al. |
| 2010/0248484 A1 | 9/2010 | Bower et al. |
| 2010/0258710 A1 | 10/2010 | Wiese et al. |
| 2010/0317132 A1 | 12/2010 | Rogers et al. |
| 2011/0211348 A1 | 9/2011 | Kim |
| 2012/0119249 A1 | 5/2012 | Kim et al. |
| 2012/0223875 A1 | 9/2012 | Lau et al. |
| 2012/0228669 A1 | 9/2012 | Bower et al. |
| 2012/0314388 A1 | 12/2012 | Bower et al. |
| 2013/0015483 A1 | 1/2013 | Shimokawa et al. |
| 2013/0069275 A1 | 3/2013 | Menard et al. |
| 2013/0088416 A1 | 4/2013 | Smith et al. |
| 2013/0196474 A1 | 8/2013 | Meitl et al. |
| 2013/0207964 A1 | 8/2013 | Fleck et al. |
| 2013/0214304 A1* | 8/2013 | Kim ........................ H01L 33/58 257/89 |
| 2013/0221355 A1 | 8/2013 | Bower et al. |
| 2013/0270596 A1* | 10/2013 | Senellart ................ B82Y 20/00 257/98 |
| 2013/0273695 A1 | 10/2013 | Menard et al. |
| 2014/0104243 A1 | 4/2014 | Sakariya et al. |
| 2014/0175498 A1 | 6/2014 | Lai |
| 2014/0217448 A1 | 8/2014 | Kim et al. |
| 2014/0231839 A1 | 8/2014 | Jeon et al. |
| 2014/0231851 A1 | 8/2014 | Tsai et al. |
| 2014/0264763 A1 | 9/2014 | Meitl et al. |
| 2014/0267683 A1 | 9/2014 | Bibl et al. |
| 2014/0306248 A1 | 10/2014 | Ahn et al. |
| 2014/0367633 A1* | 12/2014 | Bibl ................. G02F 1/133603 257/13 |
| 2014/0367705 A1 | 12/2014 | Bibl et al. |
| 2015/0034975 A1* | 2/2015 | Rudmann ......... H01L 27/14625 257/82 |
| 2015/0135525 A1 | 5/2015 | Bower |
| 2015/0137153 A1 | 5/2015 | Bibl et al. |
| 2015/0263066 A1 | 9/2015 | Hu et al. |
| 2015/0280066 A1 | 10/2015 | Fujimura et al. |
| 2015/0280089 A1 | 10/2015 | Obata et al. |
| 2015/0312165 A1* | 10/2015 | Nemeth ................. H04L 47/722 709/213 |
| 2015/0362165 A1 | 12/2015 | Chu et al. |
| 2015/0371585 A1 | 12/2015 | Bower et al. |
| 2015/0371974 A1 | 12/2015 | Bower et al. |
| 2015/0372051 A1 | 12/2015 | Bower et al. |
| 2015/0372052 A1 | 12/2015 | Bower et al. |
| 2015/0372053 A1 | 12/2015 | Bower et al. |
| 2015/0373793 A1 | 12/2015 | Bower et al. |
| 2016/0005721 A1 | 1/2016 | Bower et al. |
| 2016/0018094 A1 | 1/2016 | Bower et al. |
| 2016/0064363 A1 | 3/2016 | Bower et al. |

(56) References Cited

U.S. PATENT DOCUMENTS

| | | |
|---|---|---|
| 2016/0093600 A1 | 3/2016 | Bower et al. |
| 2017/0048976 A1 | 2/2017 | Prevatte et al. |
| 2017/0154819 A1 | 6/2017 | Bower et al. |

FOREIGN PATENT DOCUMENTS

| | | |
|---|---|---|
| WO | WO-2008/103931 A2 | 8/2008 |
| WO | WO-2010/032603 A1 | 3/2010 |
| WO | WO-2010/132552 A1 | 11/2010 |
| WO | WO-2013/064800 A1 | 5/2013 |
| WO | WO-2014/121635 A1 | 8/2014 |
| WO | WO-2014/149864 A1 | 9/2014 |

OTHER PUBLICATIONS

Roscher, H., VCSEL Arrays with Redundant Pixel Designs for 10Gbits/s 2-D Space-Parallel MMF Transmission, Annual Report, optoelectronics Department. (2005).

Yaniv et al., A 640 × 480 Pixel Computer Display Using Pin Diodes with Device Redundancy, 1988 International Display Research Conference, IEEE, CH-2678-1/88:152-154 (1988).

* cited by examiner

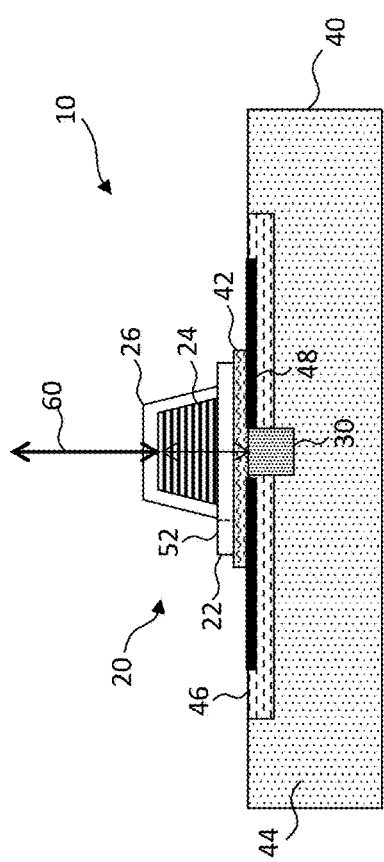
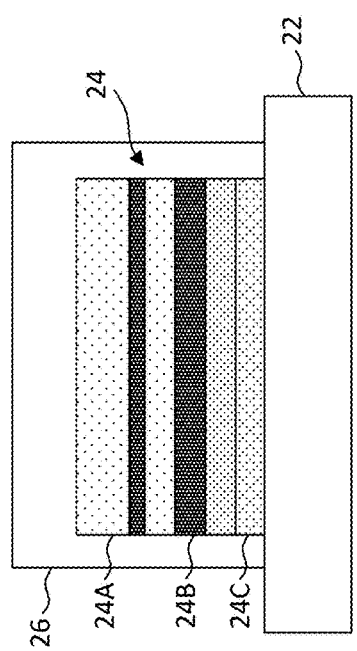
FIG. 1
FIG. 2

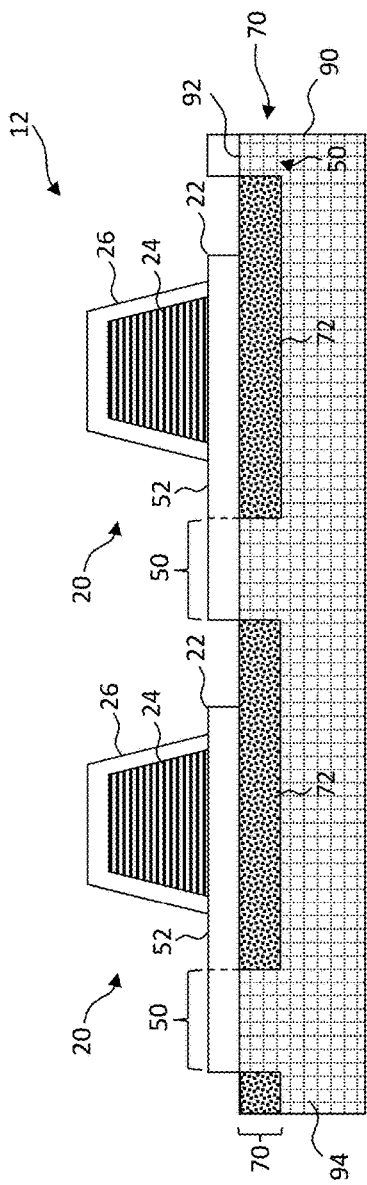
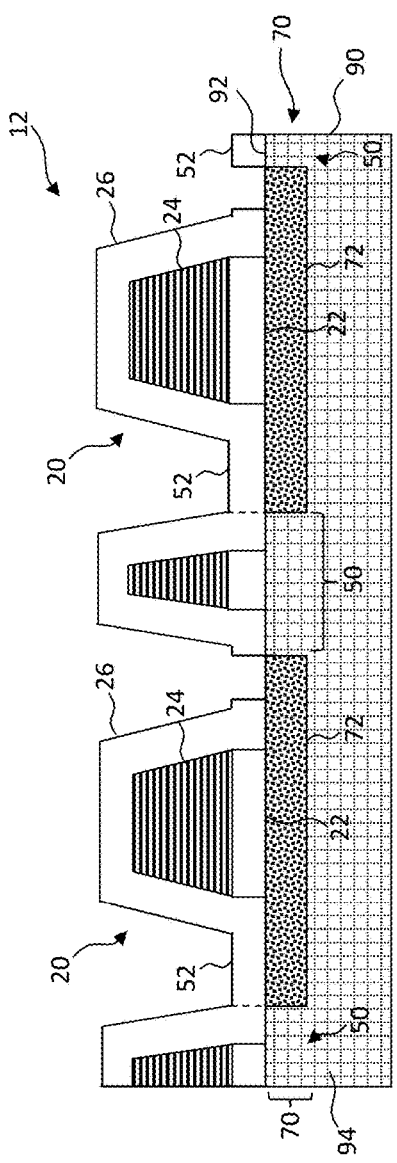
FIG. 4
FIG. 5

COMPOUND MICRO-TRANSFER-PRINTED OPTICAL FILTER DEVICE

FIELD OF THE INVENTION

The present invention relates to an integrated heterogeneous optical filter device constructed using micro-transfer printing.

BACKGROUND OF THE INVENTION

Electro-optical circuits are widely used in communication and sensing devices. In particular, optical filters that rely upon layers of alternating materials having different refractive indices providing constructive and destructive optical interference are widely used. Such filters can transmit or reflect particular frequency ranges of electromagnetic radiation.

Proximity sensors are sensors that detect nearby objects and are commonly used in smartphones and for industrial applications to measure the distance between machine components. In one implementation, proximity sensors include a light emitter and a light sensor that senses the light emitted and measures the time between light emission and sensing light reflected from an object to determine a distance to the object that depends on the speed of light. The light emitted is typically infrared radiation invisible to human beings, such as light from an infrared light-emitting diode (LED). However, light sensors, such as silicon photodiodes or silicon phototransistors are generally responsive to a wide range of light frequencies. In order to improve the signal-to-noise ratio of the sensed signal, an optical filter is provided that substantially transmits only the specific frequencies of the emitted light so that the light sensed by the light sensor is limited to the emitted light.

Sensors with optical interference filters are conventionally constructed by providing a semiconductor substrate, such as silicon, and photolithographically forming a light sensor in the semiconductor substrate. Optical filter layers are blanket deposited and then patterned over the light sensor using resist lift-off methods. Alternatively, a shadow mask is provided with an opening positioned over the light sensor. Multiple layers of different materials are deposited over the shadow mask and the opening over the light sensor, for example by evaporation, to form the optical filter on the light sensor. The shadow mask is then removed. Other patterning methods are also possible, such as etching. For example, U.S. Pat. No. 8,803,068, U.S. Pat. No. 8,624,341, and U.S. Pat. No. 8,598,672 describe patterned interference filters deposited on a silicon substrate using sputtering, vapor deposition, electrochemical deposition, molecular beam epitaxy, and atomic layer deposition, all of which provide optical layers that are essentially welded or fused to or form co-valent bonds with the underlying substrate. Other structures using multiple substrates with molded or cast interference filters are known, for example as taught in U.S. Pat. No. 8,143,608.

However, this process is very wasteful, since only the portion of the optical filter layer materials that remains after lift-off or that pass through the shadow mask is used. Furthermore, the process is sequential, as the light sensor must be made first before the optical filter is applied over the light sensor, increasing the elapsed manufacturing time. Thus, if multiple optical filters are formed on a common substrate, the deposition process must be repeatedly and sequentially performed, leading to further waste in materials and time.

There is a need, therefore, for improved integration of optical filters in electro-optical applications and devices.

SUMMARY OF THE INVENTION

Embodiments of the present invention provide a compound optical filter device comprising a semiconductor substrate having an optical transducer formed in or on the semiconductor substrate, the optical transducer responsive to light to produce a signal or responsive to a signal to emit light. An optical filter comprises a filter substrate separate and independent from the semiconductor substrate and one or more optical filter layers disposed on the filter substrate. The filter substrate is micro-transfer printed on or over the semiconductor substrate or on layers formed over the semiconductor substrate and over the optical transducer to optically filter the light to which the optical transducer is responsive or to optically filter the light emitted by the optical transducer. In further embodiments, the optical filter is an interference filter and the semiconductor substrate includes active components that can control or operate the optical transducer. An additional optical transducer can be provided on or in the semiconductor substrate or provided on another substrate and micro-transfer printed onto the semiconductor substrate. An additional optical filter can be provided over the additional optical transducer to optically filter the light to which the optical transducer is responsive or to optically filter the light emitted by the optical transducer. The optical transducers can be light emitters or light sensors; in one embodiment a proximity sensor includes at least one light emitter and one light sensor with an optical filter over the at least one light sensor.

In various embodiments, the optical filter substrate is thicker than any one of the optical filter layers, the optical filter substrate comprises a material different from any material found in the optical filter layers, or the optical filter substrate has an extent over the semiconductor substrate that is greater than the extent of any of the optical filter layers over the semiconductor substrate. The optical filter substrate can include at least a portion of a tether, for example a fractured tether fractured during the process of micro-transfer printing the optical filter from a source wafer to the semiconductor substrate. A layer of adhesive between the optical filter substrate and the semiconductor substrate can adhere the optical filter substrate to the semiconductor substrate and can extend over the semiconductor substrate to an extent that is different from the extent of any of the optical filter layers over the semiconductor substrate. According to other embodiments of the present invention, the optical filters include a protective encapsulation layer. The encapsulation layer can include at least a portion of a tether, can be thicker than any one of the optical filter layers, can comprise a material different from any material found in the optical filter layers, or can have an extent over the semiconductor substrate that is greater than the extent of any of the optical filter layers over the semiconductor substrate.

In another embodiment of the present invention, an optical filter wafer comprises a wafer of substrate material. A patterned sacrificial layer is formed on, over, or in the substrate material to define separate anchors separated at least in part by the patterned sacrificial layer. A chemically selective etch-resistant optical filter substrate having a chemical selectivity different from the patterned sacrificial layer is disposed over the patterned sacrificial layer and attached to the anchors to form tethers adjacent to the anchors over the patterned sacrificial layer that physically connect the optical filters to the anchors. One or more optical filter layers are patterned over or on the filter substrate to form a corresponding plurality of optical filters over the sacrificial layer pattern. A plurality of optical filter wafers can be made having a corresponding variety of different optical filter layers to form optical filters with different optical characteristics, for example light-absorbing or light-transmissive notch filters, infrared filters, UV filters, or photopic filters. The optical filters on the optical filter wafer are formed at a higher spatial density than on a final device thereby improving manufacturing efficiency and reducing costs.

A semiconductor substrate can be provided and one or more optical transducers formed in or on the semiconductor substrate, the optical transducer responsive to light to produce a signal or responsive to a signal to emit light. Alternatively, the semiconductor substrate can be provided with the optical transducer already formed in or on the semiconductor substrate. Active circuitry can also be formed or provided in the semiconductor substrate. The optical filters from one or more of the optical wafers can then be micro-transfer printed to the semiconductor substrate and correspondingly disposed over the one or more optical transducers. Alternatively, an additional optical transducer is formed in a separate, independent, and distinct substrate and micro-transfer printed onto or over the semiconductor substrate and an optical filter micro-transfer printed onto the additional optical transducer before or after the optical transducer is micro-transfer printed on the semiconductor substrate. For example, the additional optical transducer is a light emitter such as a light-emitting diode or diode laser and is formed in or on a light-emitter substrate separate, distinct, and independent of the semiconductor substrate and the filter substrate.

The present invention provides advantages over optical filter and light sensor assemblies of the prior art. According to embodiments of the present invention, a much higher density of optical filters is achieved by forming the optical filters over a filter substrate. This reduces the amount of wasted optical filter material. Furthermore, by micro-transfer printing the optical filters over a light transducer, multiple optical filters can be provided without requiring multiple, sequential deposition and patterning of optical filter layers, greatly reducing the time required to make the integrated component. Furthermore, different processes optimized for different materials can be used to make the various optical filters and the semiconductor substrate, optical transducer, and active circuit, improving their performance.

Embodiments of the present invention therefore enable compound optical filter devices comprising a variety of different heterogeneous materials that can each be processed or assembled separately using different, possibly incompatible, processes and at higher densities, thereby reducing costs and improving performance. By micro-transfer printing multiple, different optical filters onto a substrate having corresponding multiple optical transducers, manufacturing cycle time and costs are reduced and higher performance enabled.

In one aspect, the disclosed technology includes a compound optical filter device, the device including: a semiconductor substrate; an optical transducer formed on the semiconductor substrate, the optical transducer responsive to light to produce a signal or responsive to a signal to emit light; and an optical filter comprising an optical filter substrate separate and independent from the semiconductor substrate and one or more optical filter layers disposed on the optical filter substrate; wherein the optical filter is micro-transfer printed on or over the semiconductor substrate and over the optical transducer to optically filter the light to which the optical transducer is responsive or to optically filter the light emitted by the optical transducer.

In certain embodiments, the optical filter layers comprise at least a first optical filter layer having a first optical index of refraction and a second optical filter layer having a second optical index of refraction different from the first optical index of refraction.

In certain embodiments, the optical filter comprises at least a first layer having a first thickness and a second layer having a second thickness different from the first thickness.

In certain embodiments, the optical filter is a dichroic, thin-film, or interference filter.

In certain embodiments, at least one of (i), (ii), and (iii) is true: (i) the optical filter substrate is thicker than any one of the optical filter layers, (ii) the optical filter substrate comprises a material different from any material found in the optical filter layers, and (iii) the optical filter substrate has an extent over the semiconductor substrate that is greater than the extent of any of the optical filter layers over the semiconductor substrate.

In certain embodiments, the device includes a layer of adhesive between the optical filter and the semiconductor substrate to adhere the optical filter to the semiconductor substrate.

In certain embodiments, the layer of adhesive has an extent over the semiconductor substrate that is different from the extent of any of the optical filter layers over the semiconductor substrate.

In certain embodiments, the optical filter comprises an encapsulation layer formed on a side of the optical filter layers opposite the optical filter substrate or formed on a side of the optical filter layers that is substantially non-parallel to the surface of the semiconductor substrate on which the optical filter is micro-transfer printed.

In certain embodiments, at least one of (i), (ii), and (iii) is true: (i) the encapsulation layer is thicker than any one of the optical filter layers, (ii) the encapsulation layer comprises a material different from any material found in the optical filter layers, and (iii) the encapsulation layer has an extent over the semiconductor substrate that is greater than the extent of any of the optical filter layers over the semiconductor substrate, or the encapsulation layer has a tension or compression that is matched to the tension or compression of the optical filter substrate so that the optical filter is flat.

In certain embodiments, the encapsulation layer comprises at least a portion of a tether.

In certain embodiments, the encapsulation layer is chemically etch-resistant.

In certain embodiments, the optical filter substrate is chemically etch-resistant.

In certain embodiments, the optical filter substrate comprises at least a portion of a tether.

In certain embodiments, the semiconductor substrate comprises a semiconductor material and one or more layers formed on, in, or over the semiconductor material and between the semiconductor material and the optical filter.

In certain embodiments, the one or more layers comprises one or more of an electrical insulator, a patterned electrical insulator, a dielectric, a patterned dielectric, an electrical conductor, or a patterned electrical conductor.

In certain embodiments, the optical transducer is a light sensor or a light emitter.

In certain embodiments, the light emitter is formed on a light-emitter substrate separate, distinct, and independent of the semiconductor substrate and the optical filter substrate and the light emitter is micro-transfer printed on the semiconductor substrate.

In certain embodiments, the semiconductor substrate comprises silicon, the optical transducer comprises silicon, the optical transducer is a silicon photodiode, the optical transducer is a silicon phototransistor, the optical transducer is a light-emitting diode, the optical transducer is a micro-light-emitting diode, the optical transducer is a laser, the optical transducer is a diode laser, or the optical transducer is a vertical cavity surface-emission laser.

In certain embodiments, the optical transducer is a first optical transducer and comprising a second optical transducer formed on the semiconductor substrate, the optical transducer responsive to light to produce a signal or responsive to a signal to emit light.

In certain embodiments, the first optical transducer is a light emitter responsive to a signal to emit light and the second optical transducer is a light sensor responsive to light to produce a signal.

In certain embodiments, the compound optical filter device is a proximity sensor.

In certain embodiments, the optical filter is a first optical filter, the optical filter substrate is a first optical filter substrate, the optical layers are first optical filter layers, and the device includes a second optical filter comprising a second optical filter substrate separate and independent from the semiconductor substrate and from the first optical filter substrate and one or more second optical filter layers and wherein the second optical filter substrate is located on or over the semiconductor substrate and over the second optical transducer to optically filter the light to which the second optical transducer is responsive or to optically filter the light emitted by the second optical transducer.

In certain embodiments, the second optical filter is disposed on the second optical transducer and the second optical transducer is disposed on the semiconductor substrate.

In certain embodiments, the first optical filter layers have a different number, material, transparency, index of refraction, or thickness than the second optical filter layers so that the first optical filter filters light differently from the second optical filter.

In certain embodiments, the device includes an active electronic circuit comprising active elements electrically connected to the optical transducer with electrical conductors on the semiconductor substrate, and wherein the active electronic circuit controls the first optical transducer and the second optical transducer.

In certain embodiments, the device includes an active electronic circuit comprising active elements electrically connected to the optical transducer with electrical conductors on the semiconductor substrate, and wherein the active electronic circuit controls the optical transducer.

In certain embodiments, the active elements comprise CMOS transistors.

In certain embodiments, the optical filter is disposed at least in part between the active electronic circuit and a source of light and wherein the active electronic circuit optionally comprises a light shield between the active elements and the source of light or between the active elements and the optical filter.

In another aspect, the disclosed technology includes an optical filter wafer, the wafer including: a wafer of substrate material; a patterned sacrificial layer formed on the substrate material, a surface of the substrate material, the wafer, or a surface of the wafer, the patterned sacrificial layer defining separate anchors between portions of the sacrificial layer; an optical filter substrate disposed over the patterned sacrificial layer and attached to the anchors by tethers over the patterned sacrificial layer, wherein the optical filter substrate is chemically selective, is etch-resistant, and has a chemical selectivity different from the patterned sacrificial layer; and one or more optical filter layers patterned on the optical filter substrate to form a plurality of optical filters over the sacrificial layer pattern.

In certain embodiments, the optical filter substrate forms at least a portion of the tethers.

In certain embodiments, an encapsulation layer is formed over the one or more optical filter layers.

In certain embodiments, the encapsulation layer forms at least a portion of the tethers.

In certain embodiments, at least one of (i), (ii), and (iii) is true: (i) the patterned sacrificial layer is a patterned layer of etchable material, (ii) a portion of the substrate material that is anisotropically etchable, and (iii) a gap between the etch-resistant optical filter substrate and the substrate material.

In another aspect, the disclosed technology includes a method of making a compound optical filter device, the method including: providing an optical filter wafer; providing a semiconductor substrate having an optical transducer formed on the semiconductor substrate, the optical transducer responsive to light to produce a signal or responsive to a signal to emit light; and micro-transfer printing at least one of the optical filters from the optical filter wafer to the semiconductor substrate or to a layer formed on or over the semiconductor substrate.

In certain embodiments, the method includes providing a layer of adhesive between the semiconductor substrate and the optical transducer before micro-transfer printing the optical filters from the compound wafer to the semiconductor substrate so that the optical transducer is micro-transfer printed onto the layer of adhesive.

In certain embodiments, the method includes forming an active electronic circuit comprising active elements electrically connected to the optical transducer with electrical conductors on the semiconductor substrate.

In certain embodiments, the method includes micro-transfer printing the optical filters onto or over at least a portion of the active electronic circuit.

In certain embodiments, the compound wafer is a first optical filter wafer having first optical filters and the method includes providing a second optical filter wafer having second optical filters, and micro-transfer printing the second optical filters from the second optical filter wafer to the semiconductor substrate or a layer formed on the semiconductor substrate.

In certain embodiments, the first optical filters are different filters than the second optical filters.

In certain embodiments, the method includes a third optical filter layer having a third optical index of refraction different from the first optical index of refraction and different from the second optical index of refraction.

In certain embodiments, the method includes a third optical filter layer having a third thickness different from the first thickness and different from the second thickness.

In certain embodiments, the optical transducer is a light sensor, wherein the optical filter is micro-transfer printed on or over the semiconductor substrate and over the optical transducer to optically filter the light to which the optical transducer is responsive.

In certain embodiments, the optical transducer is a light emitter, wherein the optical filter is micro-transfer printed on or over the semiconductor substrate and over the optical transducer to optically filter the light emitted by the optical transducer.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which:

FIG. 1 is a cross section of an embodiment of the present invention;

FIG. 2 is a detail cross section of an optical filter according to an embodiment of the present invention;

FIG. 4 is a cross section of an optical filter wafer according to another embodiment of the present invention;

FIG. 5 is a cross section of an optical filter wafer according to an embodiment of the present invention;

Figure 3:
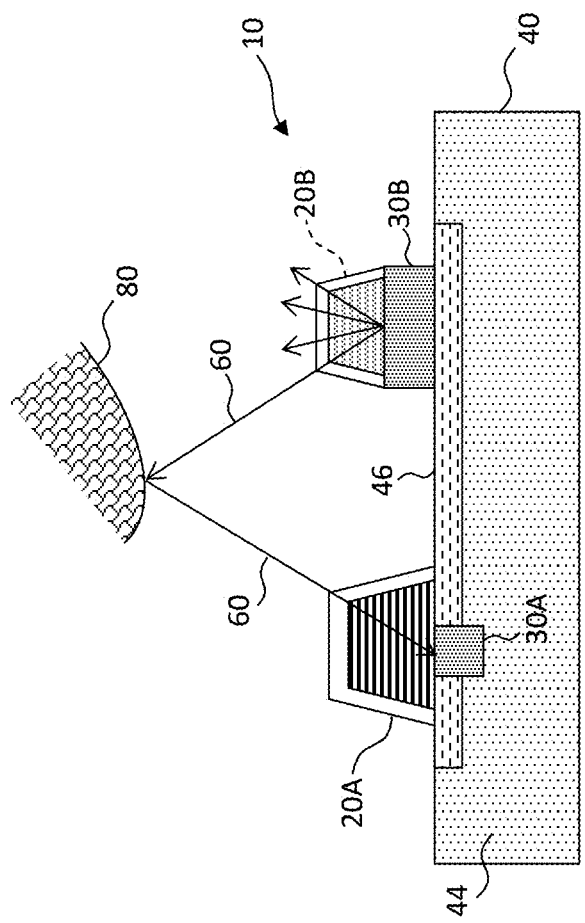
FIG. 3 is a cross section of a proximity sensor according to another embodiment of the present invention.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not drawn to scale since the variation in size of various elements in the Figures is too great to permit depiction to scale.

DETAILED DESCRIPTION OF THE INVENTION

Referring to the cross section of FIG. 1, a compound optical filter device 10 comprises a semiconductor substrate 40 having an optical transducer 30 formed in or on the semiconductor substrate 40. The optical transducer 30 is responsive to light 60 (e.g., incident light illuminating the optical transducer 30) to produce a signal or is responsive to a signal to emit light 60. An optical filter 20 comprises an optical filter substrate 22 separate, distinct, and independent from the semiconductor substrate 40 and one or more optical filter layers 24 disposed on the optical filter substrate 22. The optical filter device is a compound optical filter device 10 because it incorporates two different substrates (e.g., the semiconductor substrate 40 and the optical filter substrate 22). In certain embodiments, the two different substrates include two different materials. The two different materials can have different attributes, can be processed separately, or can be process incompatible. The optical filter 20 is micro-transfer printed on or over the semiconductor substrate 40 and over the optical transducer 30 to optically filter the light 60 to which the optical transducer 30 is responsive or to optically filter the light 60 emitted by the optical transducer 30. In an embodiment, the optical filter 20 is disposed on the semiconductor substrate 40 with the optical filter substrate 22 between the optical filter layers 22 and the semiconductor substrate 40, as shown. In another embodiment, the optical filter 20 is disposed on the semiconductor substrate 40 with the optical filter layers 22 between the optical filter substrate 22 and the semiconductor substrate 40 (not shown).

To facilitate mounting the optical filter 20 to the semiconductor substrate 40, a layer 42 of adhesive can be provided between the optical filter 20 and the semiconductor substrate 40 to adhere the optical filter 20 to the semiconductor substrate 40. The adhesive layer 42 can have an extent over the semiconductor substrate 40 that is different from the extent of any of the optical filter layers 24 over the semiconductor substrate 40. For example, the adhesive layer 42 can extend beyond the optical filter layers 24, or the optical filter substrate 22 (as shown), or the optical filter layers 24 can extend beyond the adhesive layer 42 (not shown). The adhesive can be curable, for example responsive to heat or electromagnetic radiation to cure and adhere the optical filter substrate 22 to the semiconductor substrate 40. The adhesive can be a cross linkable polymer or resin, for example SU8, and can be coated on the semiconductor substrate 40 or the optical filter substrate 22, or both, or provided as a laminate between the semiconductor substrate 40 and the optical filter 20. The adhesive can be patterned and materials and techniques for patterning curable adhesives are known.

In an embodiment, the optical filter 20 comprises an encapsulation layer 26 formed on a side of the optical filter layers 24 opposite the optical filter substrate 22. In another embodiment, the optical filter 20 comprises an encapsulation layer 26 formed on a side of the optical filter layers 24 different from the optical filter substrate 22, such as a side of the optical filter layers 24 that is not substantially parallel to the semiconductor substrate 40 surface onto which the optical filter 20 is micro-transfer printed. The encapsulation layer 26 can have a thickness equal to, greater than, or less than the thickness of the optical filter layer 22. In an embodiment, the tension or compression in the optical filter layer 22 is matched to the tension or compression in the encapsulation layer 26 so that the optical filter 20 is flat.

A semiconductor substrate 40 is any substrate in which active electronic circuits 46 and active electronic elements including semiconductor devices such as transistors, diodes, light-emitting diodes, diode lasers, photodiodes, or phototransistors can be formed, for example silicon substrates or III-V semiconductor substrates. The semiconductor substrate 40 can also include passive electronic circuits 46, such as conductors, resistors, and capacitors. A passive electronic circuit 46 can include only patterned electrical conductors. The semiconductor substrate 40 can include semiconductor material 44 that can be crystalline material such as crystalline silicon suitable for high-performance electronics. The semiconductor substrate 40 can include one or more layers of material that are not semiconductor material 44 formed on, in, or over the semiconductor material 44 between the semiconductor material 44 and the optical filter 20, for example insulators, patterned insulators, dielectrics, patterned dielectrics, or patterned electrical conductors, and that can be used to form passive electronic devices such as capacitors and resistors and planarizing, electrically insulating, or protective layers.

In embodiments of the present invention, the semiconductor substrate 40 can have two relatively flat and substantially parallel opposing sides and can be any structure having a process side suitable for the deposition, processing, and patterning of active and passive electronic structures useful in forming a passive or active electronic circuit 46. Such structures can include transistors, diodes, conductors, capacitors, and resistors and include patterned semiconductor structures, doped semiconductor structures, dielectrics such as silicon oxides and silicon nitrides, and conductors such as aluminum, copper, gold, silver, titanium, tantalum, and tin or alloys of such materials. For example, photolithographic processes for making integrated circuits can be employed with suitable semiconductor substrates 40. The semiconductor substrates 40 can include semiconductor materials 44 such as silicon or compound semiconductor materials 44 composed of two or more elements from different groups of the periodic table such as a III-V or II-VI semiconductor substrate 40. In an embodiment, the semiconductor substrate 40 is a crystalline semiconductor substrate 40 such as a crystalline silicon semiconductor in which circuits, such as CMOS circuits, can be formed using photolithographic processes.

In particular, the additional layers of material included in the semiconductor substrate 40 can be located between the semiconductor material 44 and the optical filter 20 or adjacent to the optical filter 20. The semiconductor devices, active electronic elements, or active electronic circuit 46 can include CMOS transistors. In an embodiment, the electronic circuit 46 includes active elements (e.g., transistors or diodes) electrically connected to the optical transducer 30 with passive electrical conductors (e.g., wires) in or on the semiconductor substrate 40, for example to control the optical transducer 30, receive signals from the optical transducer 30, or to receive signals from the optical transducer 30.

An optical transducer 30 is a device that converts some form of energy to light 60 or converts light 60 to another form of energy. In an embodiment, the form of energy is electricity. As used herein, light 60 refers to electromagnetic radiation of any frequency, including infrared, ultraviolet, or visible radiation. The optical transducer 30 can be a light sensor (e.g., a silicon photodiode or silicon phototransistor) or a light emitter (e.g., a light-emitting diode or LED). The light emitter can be formed in or on a light-emitter substrate separate, distinct, and independent of the semiconductor substrate 40 and the optical filter substrate 22 and can be micro-transfer printed onto the semiconductor substrate 40. In various embodiments, the semiconductor substrate 40 comprises silicon, the optical transducer 30 comprises silicon, the optical transducer 30 is a silicon photodiode, the optical transducer 30 is a silicon phototransistor, the optical transducer 30 is a light-emitting diode, the optical transducer 30 is a micro-light-emitting diode, the optical transducer 30 is a laser, the optical transducer 30 is a diode laser, or the optical transducer 30 is a vertical cavity surface-emission laser. The light-emitter substrate can be silicon, or a compound semiconductor such as GaAs, AlGaAs, GaAsP, GaP, AlGaInP, GaN, InGaN, ZnSe, or SiC.

The optical filter 20 can be a dichroic, thin-film, or interference filter including a plurality of different layers, for example having thicknesses from 10 to 500 nm although other thicknesses outside this range are possible. A variety of useful thin-film optical layer 24 materials are also known, for example silica and tantalum oxide. An optical filter 20 transmits or reflects a portion of the light 60 incident on the filter. Typically, an optical filter 20 transmits or reflects particular ranges of electromagnetic radiation, for example excluding a range of frequencies or including a range of frequencies. Referring also to FIG. 2, the optical filter layers 24 include at least a first optical filter layer 24A having a first optical index of refraction and a second optical filter layer 24B having a second optical index of refraction different from the first optical index of refraction (illustrated in FIG. 1 with alternating black and white horizontal lines). In one embodiment, the first and second optical filter layers 24A, 24B have the same thickness. In another embodiment, the optical filter 20 includes at least a first optical filter layer 24A having a first thickness and a second optical filter layer 24B having a second thickness different from the first thickness. In another embodiment, the optical filter layers 24 include three optical filter layers 24 each comprising a different material (e.g., optical filter layer 24C) having a different optical refractive index. In another embodiment, the optical filter substrate 22 is a semiconductor with a bandgap chosen to filter the light passing through the semiconductor so that the optical filter substrate 22 is an optical filter 20.

In various embodiments of the present invention, the optical filter substrate 22 can be an oxide or nitride, for example silicon oxide, silicon dioxide, silicon nitride, a thermal oxide, or a dielectric. As illustrated in FIGS. 1 and 2, the optical filter substrate 22 can be thicker than any one of the optical filter layers 24. The optical filter substrate 22 can comprise a material different from any material found in the optical filter layers 24 (indicated by different layer fill patterns in FIG. 2). The optical filter substrate 22 can have an extent over the semiconductor substrate 40 in a direction substantially parallel to the semiconductor substrate 40 that is greater than the extent of any of the optical filter layers 24 over the semiconductor substrate 40. For example, the area of the optical filter substrate 22 in a plane substantially horizontal to the surface of the semiconductor substrate 40 on which the optical filter 20 is micro-transfer printed is greater than the extent of any of the optical filter layers 24 in the same plane. The optical filter substrate 22 can be a chemically etch-resistant material, such as silicon nitride. In a further embodiment, the optical filter substrate 22 comprises at least a portion of a tether 52.

In embodiments of the present invention, the encapsulation layer 26 can be an oxide or nitride, for example silicon oxide, silicon dioxide, silicon nitride, or a dielectric. As illustrated in FIGS. 1 and 2, the encapsulation layer 26 can be thicker than any one of the optical filter layers 24. The encapsulation layer 26 can comprise a material different from any material found in the optical filter layers. The encapsulation layer 26 can have an extent over the semiconductor substrate 40 that is greater than the extent of any of the optical filter layers 24 over the semiconductor substrate 40. For example, the area of the encapsulation layer 26 is greater than the extent of any of the optical filter layers 24 in a plane substantially parallel to the surface of the semiconductor substrate 40 on which the optical filter 20 is micro-transfer printed. The encapsulation layer 26 can be a chemically etch-resistant encapsulation layer 26, for example silicon nitride. In a further embodiment, the encapsulation layer 26 comprises at least a portion of a tether 52.

As used herein, an etch-resistant material is a material that resists etching by whatever etchant is used to etch the optical filter wafer sacrificial layer, as discussed further below.

Referring to FIG. 3, in a further embodiment of the present invention, the compound optical filter device 10 includes a plurality of optical transducers 30A, 30B. At least one of the optical transducers 30A receives light 60 through the optical filter 20A. Other optical transducers 30A can also receive light 60 through an optical filter 20A or can receive unfiltered light 60 from the environment (not shown). Alternatively, one or more optical transducers 30B can optionally emit light 60 through an optical filter 20B (as shown for one light-emitting optical transducer 30B). Thus, according to embodiments of the present invention, the optical transducer 30 of the compound optical filter device 10 is a first optical transducer 30A and the compound optical filter device 10 includes a second optical transducer 30B formed in or on the semiconductor substrate 40 responsive to light 60 to produce a signal or responsive to a signal to emit light 60.

The compound optical filter device 10 of the present invention can also include a plurality of optical filters 20A, 20B and the optical filters 20A, 20B can be the same or different. For example, the optical filters 20A and 20B can transmit frequencies of light 60 in different amounts such as a red optical filter 20 that substantially transmits red light 60, a green optical filter 20 that substantially transmits green light 60, a blue optical filter 20 that substantially transmits blue light 60, an infrared optical filter 20 that substantially transmits infrared light 60, a UV optical filter 20 that substantially transmits ultra-violet light 60, or a photopic filter whose transmission characteristics match that of the human visual system. Thus, in an embodiment of the compound optical filter device 10 of the present invention, the optical filter 20 of FIG. 1 is a first optical filter 20A, the optical filter substrate 22 is a first optical filter substrate 22, and the optical layers 24 are first optical filter layers 24. In an embodiment of the present invention, the compound optical filter device 10 also includes a second optical filter 20B comprising a second optical filter substrate 22 separate and independent from the semiconductor substrate 40 and from the first optical filter substrate 22 and includes one or more second optical filter layers 24. The second optical filter 20 is located on or over the semiconductor substrate 40 and over the second optical transducer 30B to optically filter the light 60 to which the second optical transducer 30B is responsive or to optically filter the light 60 emitted by the second optical transducer 30B. In an embodiment of the present invention and as illustrated in FIG. 3, the second optical filter 20B is disposed on the second optical transducer 30B and the second optical transducer 30B is disposed on the semiconductor substrate 40. According to various embodiments of the present invention, the first optical filter layers 24 of the first optical filter 20A can have a different number, material, transparency, index of refraction, or thickness than the second optical filter layers 24 of the second optical filter 20B so that the first optical filter 20A filters light 60 differently from the second optical filter 20B.

As shown in FIG. 3, the second optical transducer 30B is a light emitter 30B responsive to a signal to emit light 60 and the first optical transducer 30A is a light sensor 30A responsive to the light 60 to produce a signal. An optional optical filter 20B can be disposed over the light emitter 30B to filter the light 60 emitted by the light emitter 30B. The optical filter 20A filters the light 60 received by the light sensor 30A. In an embodiment, the compound optical filter device 10 is a proximity sensor. The light emitter 30B can emit infrared light 60 and the optical filters 20A, 20B can be infrared optical filters 20 that transmit infrared light 60. The optical filter 20A can substantially filter out light 60 other than frequencies of light 60 that are emitted by the light emitter 30B so that the signal produced by the optical filter 20A is substantially responsive to the light 60 emitted by the light emitter 30B. By measuring the time required for light 60 to travel from the light emitter 30B to the light sensor 30A, the distance of an object 80 reflecting the light 60 emitted from the optical transducer 30B and sensed by the optical transducer 30A can be determined.

In a further embodiment of the present invention and as also shown in FIGS. 1 and 3, the compound optical filter device 10 includes a passive or active electronic circuit 46 including active elements electrically connected to the optical transducer 30 with electrical conductors in layers in or on the semiconductor substrate 40 to provide or receive signals from the optical transducer 30. In a further embodiment of the present invention and with reference also to FIG. 3, the active electronic circuit 46 controls both the first optical transducer 30A and the second optical transducer 30B to provide or receive signals from the optical transducers 30A, 30B, for example providing a timing circuit that causes the second optical transducer 30B to emit light 60 and measures the elapsed time until the first optical transducer 30A senses the emitted light 60.

As also shown in FIG. 1, in an embodiment the optical filter 20 is disposed at least in part between the electronic circuit 46 and a source of light 60 (e.g., the environment). The electronic circuit or layers 46 on or in the semiconductor substrate 40 optionally includes a light shield 48 between the active elements and the source of light 60 or between the active elements and the optical filter 20, if present, as shown.

Referring next to FIG. 4, in other embodiments of the present invention an optical filter wafer 12 includes a substrate 90 of substrate material 94. The substrate material 94 can be a semiconductor or other material such as glass. A patterned sacrificial layer 70 is formed on, over, or in the substrate material 94 or a surface of the substrate material 94 or the substrate 90. The patterned sacrificial layer 70 defines sacrificial portions 72 that separate anchors 50 between the sacrificial portions 72 of the sacrificial layer 70, for example separating the patterned sacrificial layer 70 portions in a direction parallel to a surface 92 of the substrate 90. A chemically selective etch-resistant optical filter substrate 22 has a chemical selectivity different from the patterned sacrificial layer 70 and is disposed over the patterned sacrificial layer 70 and attached to the anchors 50 by tethers 52 over the patterned sacrificial layer 70. As noted briefly above, as used herein, an etch-resistant material is a material that resists etching by whatever etchant is used to etch the optical filter wafer sacrificial layer. Thus, the optical filter substrate 22 is resistant to whatever etchant is used to etch the sacrificial layer portions 72. One or more optical filter layers 24 are disposed or patterned over or on the optical filter substrate 22 to form a plurality of optical filters 20 over the sacrificial layer 70 pattern. The optical filters 20 are separated over the surface of the optical filter wafer 12 by the tethers 52. In the embodiment illustrated in FIG. 4, the optical filter substrate 22 forms at least a part of the tethers 52.

In a further embodiment of the present invention, the optical filter wafer 12 is a wafer having optical filters 20 that are micro-transfer printable. The optical filter 20 can comprise an encapsulation layer 26 formed over the one or more optical filter layers 24. Referring to FIG. 5, in one alternative structure, the optical filter layers 24 and encapsulation layer 26 are also disposed over the anchors 50 and the encapsulation layer 26 forms at least a part of the tethers 52. The anchors 50 can include substrate material 94 and also material deposited or formed on the substrate material 94, such as oxides or nitrides likes silicon oxide, silicon dioxide, or silicon nitride or material used in the optical filter substrate 22 and encapsulation layer 26. The anchors 50 can include portions of the encapsulation layer 26, optical filter substrate 22, or optical filter layers 24. A variety of photolithographic methods can be used to make the patterned sacrificial layer 70, the anchors 50, and the tethers 52 that connect the optical filter substrates 22 to the anchors 50.

In embodiments of the present invention, the patterned sacrificial layer 70 is a patterned layer of etchable material formed on or in the substrate 90 or substrate material 94, for example an oxide layer such as silicon dioxide that can be etched without etching the optical filter substrate 22 or encapsulation layer 26. Alternatively, the patterned sacrificial layer 70 is a defined portion of the substrate material 94 that is anisotropically etchable. For example, the substrate material 94 can be crystalline silicon with a <1 0 0> crystal orientation or a <1 1 1> orientation that enables the substrate material 94 to be anisotropically etched to form gaps in the sacrificial portions 72 and anchors 50 in the substrate 90 without etching the optical filter substrate 22 or encapsulation layer 26. In another embodiment, the patterned sacrificial layer 70 defines sacrificial portions 72 that are each a gap between the etch-resistant optical filter substrate 22 and the substrate material 94. Thus, the gap can be an etched sacrificial layer 70 portion 74 that has been sacrificed, i.e., the material of the sacrificial portion 72 has been removed by etching, so that the optical filters 20 are ready to be micro-transfer printed to another substrate, for example the semiconductor substrate 40 of the compound optical filter device 10.

Figure 6:
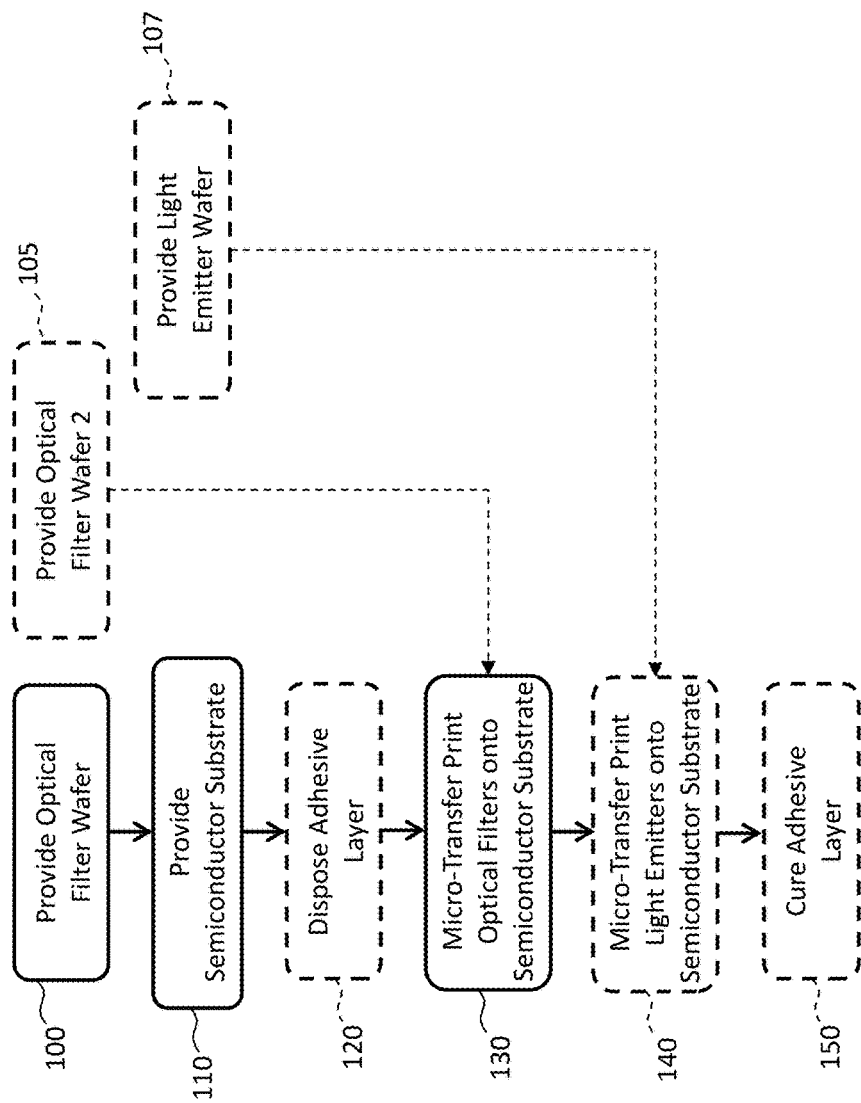
FIG. 6 is a flow diagram illustrating a method of the present invention.

Referring to FIG. 6, a method of making a compound optical filter device 10 of the present invention includes providing an optical filter wafer 12 in step 100, for example made by using photolithographic processes and comprising integrated circuit and display device materials. The semiconductor substrate 40 is provided in step 110 and has an optical transducer 30 formed in or on the semiconductor substrate 40, the optical transducer 30 responsive to light 60 to produce a signal or responsive to a signal to emit light 60, for example made by photolithographic processes and comprising integrated circuit and display device materials. (Steps 100 and 110 can be done in either order or at the same time.) An optional adhesive layer 42 is provided, for example by coating or laminating an adhesive on the semiconductor substrate 40 or on a layer formed on or over the semiconductor substrate 40 in step 120. If the sacrificial portions 72 of the optical filter wafer 12 are not etched, they can be etched to prepare the optical filters 20 on the optical filter wafer 12 for micro-transfer printing. If the sacrificial portions 72 are etched to provide a gap between the optical filter 20 and the semiconductor material 44 and tethers physically connecting the optical filters 20 to the anchors 50, at least one of the optical filters 20 can be micro-transfer printed in step 130 from the optical filter wafer 12 onto the semiconductor substrate 40, onto a layer formed on or over the semiconductor substrate 40, or onto the adhesive layer 42 on the semiconductor substrate 40 or layers on the semiconductor substrate 40. The micro-transfer printing step can fracture the tethers 52, leaving at least a portion of the tethers 52 physically connected to the optical filter 20 but disconnected from the anchors 50 and the optical filters 20 in contact with or adhered to the micro-transfer printing stamp.

At least one of the optical filters 20 is aligned with and micro-transfer printed on or over the optical transducer 30 in step 130, for example as illustrated with optical transducer 30A in FIG. 3. In a further embodiment of the present invention, an additional optical filter wafer 12 is provided in step 105 and the additional optical filters 20 from the additional optical filter wafer 12 are also micro-transfer printed onto the semiconductor substrate 40 in step 130. The additional optical filter wafer 12 can be the same as or different from the optical filter wafer 12 and the additional optical filters 20 of the additional optical filter wafer 12 can be the same as or different from the optical filters 20 of the optical filter wafer 12, for example transmitting different frequencies of light 60 in different amounts. Thus, in a method of the present invention, the optical filter wafer 12 is a first optical filter wafer 12 having first optical filters 20A and the method comprises providing a second optical filter wafer 12 having second optical filters 20B and micro-transfer printing the second optical filters 20B from the second optical filter wafer 12 to the semiconductor substrate 40 or a layer formed on the semiconductor substrate 40. The first optical filters 20A can be different from the second optical filters 20B, for example transmitting different frequencies of light 60 in different amounts.

In yet another embodiment of the present invention, a wafer of micro-transfer printable optical transducers 30 (e.g., light emitters 30B or micro-LEDs) is optionally provided in step 107 and the optical transducers 30 are optionally micro-transfer printed onto the semiconductor substrate 40 in step 140. When all of the optical filters 20 and optical transducers 30 are micro-transfer printed onto the semiconductor substrate 40, the adhesive layer 42, if present, can be cured to adhere the optical filters 20 and optical transducers 30 to the semiconductor substrate 40.

In an alternative method of the present invention, an active electronic circuit 46 including active elements electrically connected to the optical transducer 30 with electrical conductors is formed or provided in or on the semiconductor substrate 40. Such circuits can include connection pads for communicating electronic signals to external devices such as controllers (not shown) and circuits for processing, timing, or controlling the optical transducers 30 of the present invention. Active electronic circuits 46 and optical transducers 30 can be made using lithographic and integrated circuit methods. Optical filter layers 24 can be deposited using a variety of layer deposition methods including sputtering, vapor deposition, electrochemical deposition, molecular beam epitaxy, and atomic layer deposition and can be patterned using lift-off, shadow-mask, etching, or ablation methods. The optical filters 20 can be micro-transfer printed onto or over at least a portion of the active electronic circuit 46 to efficiently make use of the semiconductor substrate 40 area and reduce the size of the compound optical filter device 10 of the present invention.

For a discussion of micro-transfer printing techniques see U.S. Pat. Nos. 8,722,458, 7,622,367 and 8,506,867, each of which is hereby incorporated by reference in their entirety. Micro-transfer printing using compound micro-assembly structures and methods can also be used with the present invention, for example as described in U.S. patent application Ser. No. 14/822,868, filed Aug. 10, 2015, entitled Compound Micro-Assembly Strategies and Devices, which is hereby incorporated by reference in its entirety. U.S. patent application Ser. No. 14/743,981, filed Jun. 18, 2015, entitled Micro Assembled LED Displays and Lighting Elements, incorporated herein by reference describes micro-transfer printing structures and processes useful with optical transducers 30 of the present invention.

The optical filters 20 and, in some embodiments an optical transducer 30 such as a light emitter 30B or LED, is mounted upon, micro-transfer printed upon, or adhered to the semiconductor substrate 40. As intended herein, to be mounted upon means that separate substrates are separately produced and then brought into proximity and adhered together in some fashion, for example by micro-transfer printing. The optical filter substrate 22 and the light emitter 30B can be, for example, unpackaged bare die so that the optical filter substrate 22 is in direct contact with the semiconductor substrate 40 or with an adhesive layer 42 that is in direct contact with the semiconductor substrate 40 and the optical filter substrate 22. To be mounted upon, micro-transfer printed to, or adhered to the electronic circuit 46 or the semiconductor substrate 40 means that the optical filter substrate 22 is mounted upon, micro-transfer printed upon, or adhered to any of the elements of the electronic circuit 46, for example upon a semiconductor layer, a patterned or doped semiconductor layer or structure, a conductor layer or patterned conductor, a dielectric layer, a patterned dielectric layer, a protective layer, or any other element of the electronic circuit 46, layers on the semiconductor substrate 40, or the semiconductor substrate 40.

In contrast to mounting upon, micro-transfer printing to, or adhering to a semiconductor substrate 40, a layer formed on a semiconductor substrate 40, for example by evaporation, sputtering, atomic layer deposition, vapor deposition, electrochemical deposition, molecular beam epitaxy, or ion beam exposure, whether patterned or not or annealed or not, is fused or welded to the semiconductor layer, for example as disclosed in U.S. Pat. No. 8,803,068 referenced above. Such a structure does not include separate, independent, and distinct substrates, one mounted upon, micro-transfer printed to, or adhered to the other and is therefore distinct and different from embodiments of the present invention.

The compound optical filter device 10 of the present invention has been constructed. In this embodiment, the semiconductor substrate 40 is a crystalline silicon substrate that includes a passive or active electronic circuit 46 and a silicon photo-sensor as an optical transducer 30B with an optical filter 20 micro-transfer printed over the silicon photo-sensor. The optical filters 20 were 250×250 μm or 500×500 μm infrared-light passband filters that were micro-transfer printed onto an adhesive layer having various thicknesses ranging from 50 nm to 1.5 μm. Various optical filter substrates 22 were tested including 100 nm thick silicon nitride or one μm thermal oxide (e.g., $SiO_2$) deposited by chemical vapor deposition, both with and without a one μm silicon nitride (e.g., $Si_3N_4$) encapsulation layer. A second optical transducer 30B is a light-emitting diode (LED) that emits infrared radiation formed in a crystalline non-silicon semiconductor substrate 40 (e.g., a III-V semiconductor such as gallium arsenide). In operation, the compound optical filter device 10 is operated by providing electrical signals from a controller (not shown) through circuit connection pads to the passive or active electronic circuit 46 on the semiconductor substrate 40 and measuring the time elapsed between a signal causing the LED (light emitter 30B) to emit light and the sensor to sense light (light sensor 30A). The electronic circuit 46 can further process the signals or use them to control the optical transducers 30. Information derived from controlling the optical transducers 30 can also be processed and communicated to the controller by the active or passive electronic circuit 46.

The electronic circuit 46 is a circuit that includes active or passive components or elements. For example, an active electronic circuit 46 can include a transistor, an amplifier, or a switch. Passive components such as conductors, resistors, capacitors, and inductors can also be included in the active electronic circuit 46. Elements of the active electronic circuit 46 are electrically connected to circuit connection pads. The circuit connection pads are portions of the active electronic circuit 46 that are available to make electrical connections with electrical devices external to the active electronic circuit 46, for example such as controllers, power supplies, ground, or signal connections. The circuit connection pads can be, for example, rectangular areas of electrically conductive materials such as the conductors listed above, accessible or exposed to external elements such as wires or conductors. Electrical connections to the circuit connection pads, for example from an optical transducer 30 such as an LED, can be made using solder and solder methods, photolithographic processes, or by contacting and possibly penetrating the circuit connection pads with electrically conductive protrusions or spikes formed in or on a device with another substrate separate, distinct, and independent from the semiconductor substrate 40 and connected to a circuit in the other LED substrate, for example as described in U.S. patent application Ser. No. 14/822,864 entitled Chiplets with Connection Posts whose contents are incorporated by reference in its entirety.

The semiconductor substrate 40 and the optical filter substrate 22 can take a variety of forms, shapes, sizes, and materials. In one embodiment, the optical filter 20 is thinner than the semiconductor substrate 40. In another embodiment, the optical filter 20 is thicker than the semiconductor substrate 40. The semiconductor substrate 40 can have a thickness less than 20 microns, less than 10 microns, or less than 5 microns. The optical filter substrate 22 can have a thickness less than 10 microns, less than 5 microns, or less than 1 micron. Alternatively, the optical filter substrate 22 can have a thickness greater than 0.5 microns, greater than 1 micron, greater than 2 microns, or greater than 5 microns. Such a variety of sizes can enable highly integrated and small structures useful in a corresponding variety of electronic systems. The optical filter layers 24 can have a variety of thicknesses, for example 10 nm to 500 nm. The tethers 52 can have a thickness of several nm (e.g., 50, 100, 200, 500, 700, or 800 nm) to a few μm (e.g., 1-5 μm), for example 600 nm to 1.5 μm.

In an embodiment of the present invention the optical filter 22 or the light emitter 30B, or both, are chiplets, small integrated structures, for example bare die, that are micro-transfer printed to the semiconductor substrate 40. The integrated compound optical filter device 10 can be subsequently packaged. In various embodiments, the semiconductor substrate 40, the optical filter 20, or a substrate of the LED has a width from 2 to 5 μm, 5 to 10 μm, 10 to 20 μm, or 20 to 50 μm, the semiconductor substrate 40, the optical filter 20, or the LED substrate has a length from 2 to 5 μm, 5 to 10 μm, 10 to 20 μm, or 20 to 50 μm, or the semiconductor substrate 40, the optical filter 20, or the LED substrate has a height from 2 to 5 μm, 4 to 10 μm, 10 to 20 μm, or 20 to 50 μm. Such small substrate elements provide a high degree of integration and material utilization and consequently reduced manufacturing costs and improved performance. The integrated assembly can be a surface-mount device.

Figure 7:
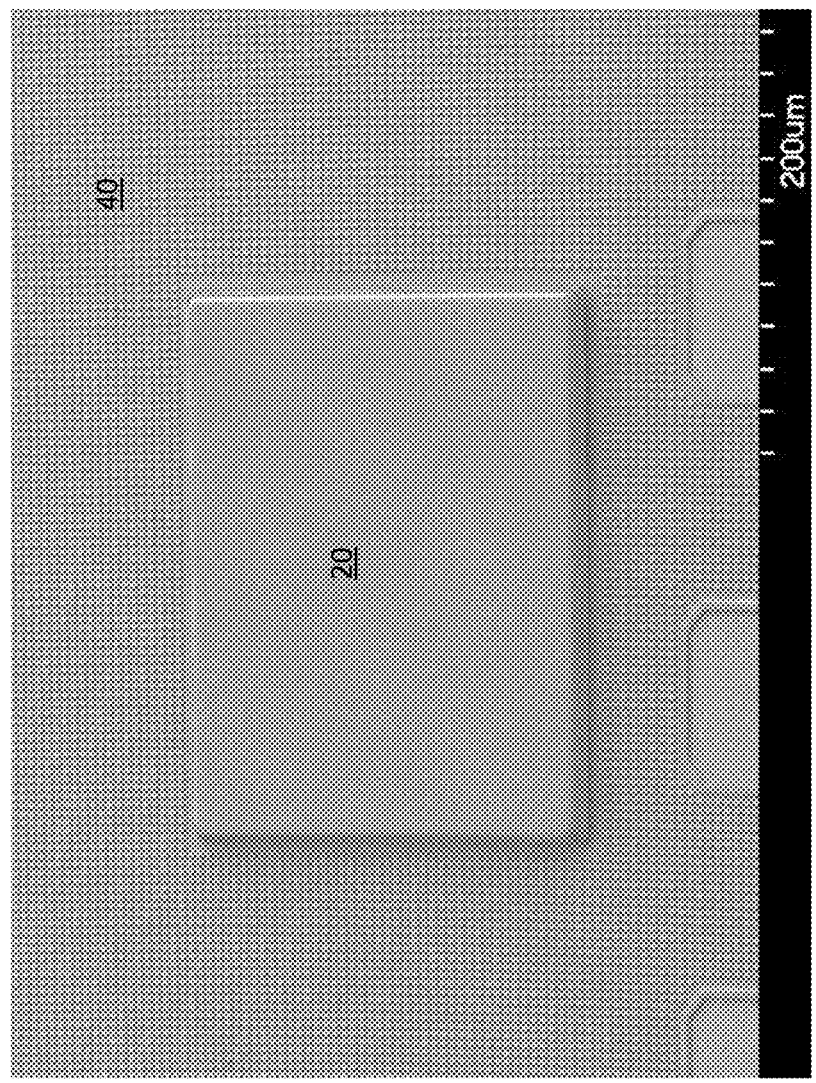
FIG. 7 is a scanning electron microscope micrograph of an embodiment of the present invention.
Figure 8:
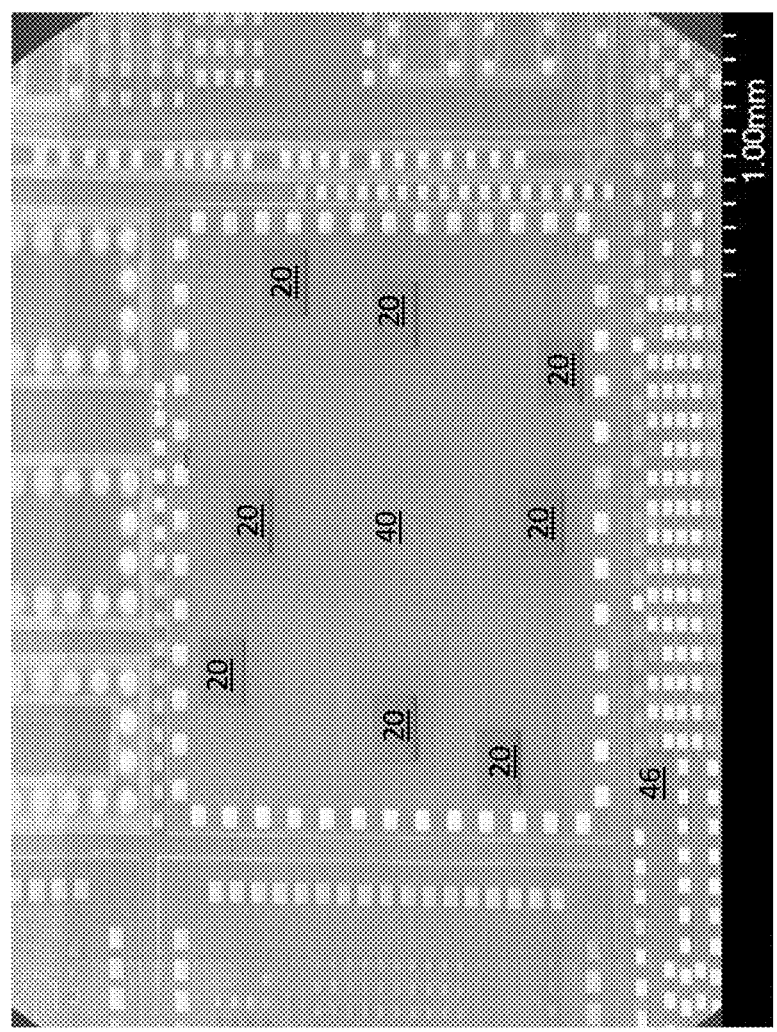
FIG. 8 is a scanning electron microscope micrograph of a plurality of optical filters on a substrate in an embodiment of the present invention.
Figure 9:
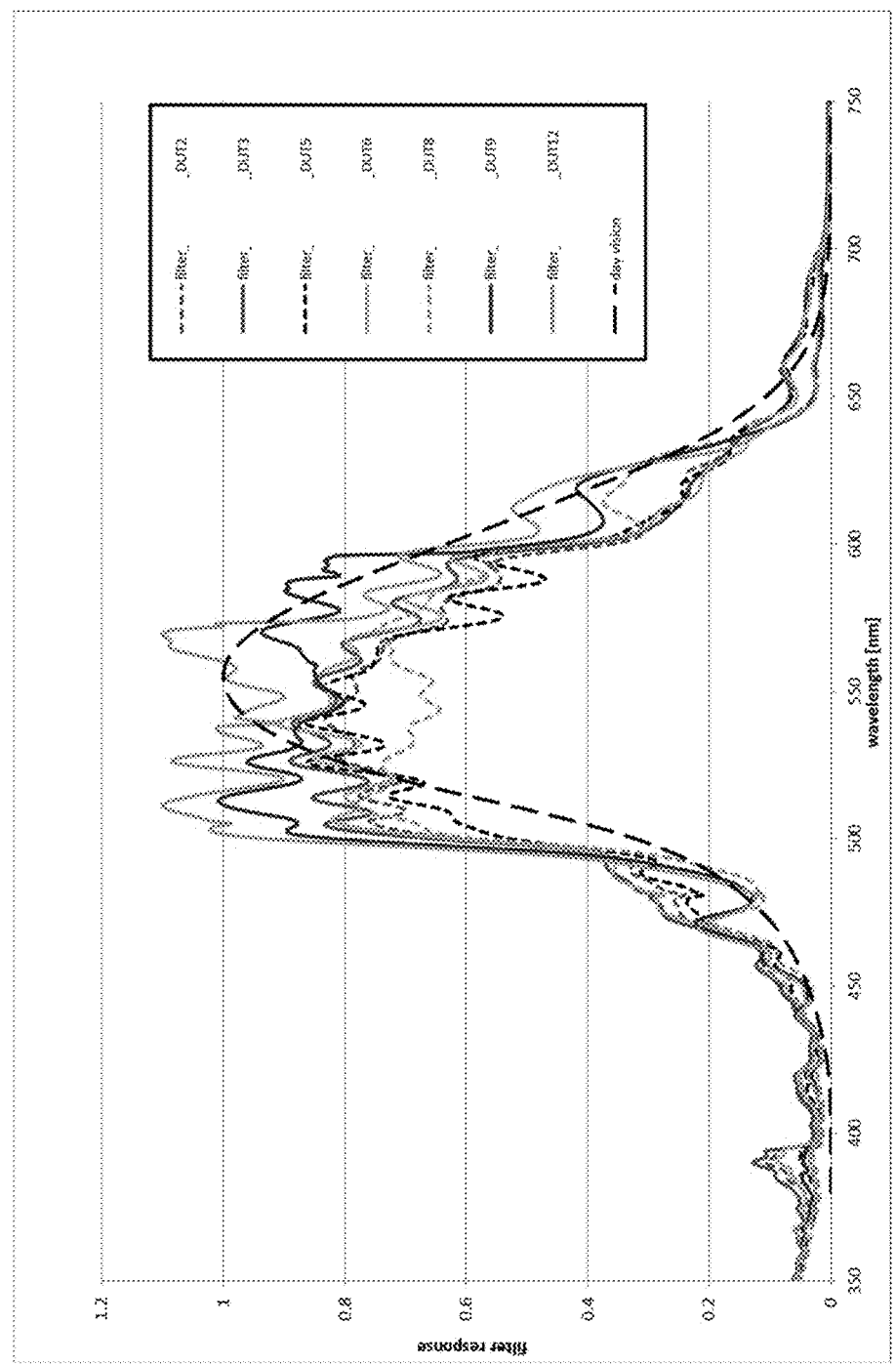
FIG. 9 is a graph of light transmission for various optical filters according to embodiments of the present invention.

Referring to FIG. 7, a semiconductor substrate 40 has a 250×250 μm optical filter 20 micro-transfer printed upon it. Referring to FIG. 8, an electronic circuit 46 and optical transducers 30 are formed on or in the semiconductor substrate 40. Eight 250×250 μm optical filters 20 are micro-transfer printed upon the semiconductor substrate 40 over the optical transducers 30. FIG. 10 is a graph illustrating the measured filter response of some of the optical filters 20. The cost of the printed compound optical filter device 10 is modeled at approximately 13% of the cost of conventional devices having comparable performance.

As is understood by those skilled in the art, the terms "over", "under", "above", "below", "beneath", and "on" are relative terms and can be interchanged in reference to different orientations of the layers, elements, and substrates included in the present invention. For example, a first layer on a second layer, in some embodiments means a first layer directly on and in contact with a second layer. In other embodiments, a first layer on a second layer can include another layer there between. Additionally, "on" can mean "on" or "in." As additional non-limiting examples, a sacrificial layer 70 or sacrificial portion 72 is considered "on" a substrate 90 when a layer of sacrificial material or sacrificial portion 72 is on top of the substrate 90, when a portion of the substrate 90 itself is the sacrificial layer 70, or when the sacrificial layer 70 or sacrificial portion 72 comprises material on top of the substrate 90 and a portion of the substrate 90 itself.

Having described certain embodiments, it will now become apparent to one of skill in the art that other embodiments incorporating the concepts of the disclosure may be used. Therefore, the invention should not be limited to the described embodiments, but rather should be limited only by the spirit and scope of the following claims.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances can be conducted simultaneously. The invention has been described in detail with particular reference to certain embodiments thereof, but it will be understood that variations and modifications can be effected within the spirit and scope of the invention.

PARTS LIST 10 compound optical filter device
12 optical filter wafer
20 optical filter
20A optical filter
20B optical filter
22 optical filter substrate
24 optical filter layer
24A first optical filter layer
24B second optical filter layer
24C third optical filter layer
26 encapsulation layer
30 optical transducer
30A first optical transducer/light sensor/photo-diode
30B second optical transducer/light emitter/LED
40 semiconductor substrate
42 adhesive layer
44 semiconductor material
46 electronic circuit/layers
48 light shield
50 anchor
52 tether/portion of tether
60 light
70 sacrificial layer
72 sacrificial portion
80 object
90 substrate
92 substrate surface
94 substrate material
100 provide optical filter wafer step
105 optional provide optical filter wafer 2 step
107 optional provide light emitter wafer step
110 provide semiconductor substrate step
120 optional dispose adhesive layer step
130 micro-transfer print optical filters onto semiconductor substrate step
140 optional micro-transfer print light emitters onto semiconductor substrate step
150 optional cure adhesive layer step

What is claimed:

1. A compound optical filter device, comprising:
a semiconductor substrate;
an optical transducer disposed in or on the semiconductor substrate, the optical transducer responsive to light to produce a signal or responsive to a signal to emit light; and
an optical filter comprising an optical filter substrate separate and independent from the semiconductor substrate and comprising at least a portion of a tether, wherein the optical filter comprises one or more optical filter layers disposed on the optical filter substrate or wherein the optical filter substrate is an optical filter;
wherein the optical filter is micro-transfer printed on and in direct contact with or directly adhered to at least one of the semiconductor substrate and the optical transducer and over the optical transducer to optically filter the light to which the optical transducer is responsive or to optically filter the light emitted by the optical transducer.

2. The compound optical filter device of claim 1, comprising a layer of adhesive in direct contact with the optical filter and between the optical filter and the semiconductor substrate to adhere the optical filter to the semiconductor substrate.

3. The compound optical filter device of claim 1, wherein the optical filter comprises an encapsulation layer disposed at least partially on a side of the one or more optical filter layers opposite the optical filter substrate and at least partially on a side of the one or more optical filter layers that is substantially non-parallel to the surface of the semiconductor substrate on which the optical filter is micro-transfer printed.

4. The compound optical filter device of claim 3, wherein the encapsulation layer comprises at least a portion of a tether.

5. The compound optical filter device of claim 1, wherein the optical filter substrate comprises at least a portion of a tether.

6. The compound optical filter device of claim 1, wherein the optical transducer is a light sensor or a light emitter.

7. The compound optical filter device of claim 6, wherein the optical transducer is a light emitter and the light emitter is disposed in or on a light-emitter substrate separate, distinct, and independent of the semiconductor substrate and the optical filter substrate and the light emitter is micro-transfer printed on the semiconductor substrate.

8. The compound optical filter device of claim 1, wherein the optical transducer is a first optical transducer and the compound optical filter device comprises a second optical transducer disposed in or on the semiconductor substrate, the second optical transducer responsive to light to produce a signal or responsive to a signal to emit light.

9. The compound optical filter device of claim 8, wherein the first optical transducer is a light emitter responsive to a signal to emit light and the second optical transducer is a light sensor responsive to light to produce a signal.

10. The compound optical filter device of claim 9, wherein the compound optical filter device is a proximity sensor.

11. The compound optical filter device of claim 8, wherein the optical filter is a first optical filter, the optical filter substrate is a first optical filter substrate, the one or more optical filter layers are one or more first optical filter layers, and the compound optical filter device comprises a second optical filter comprising a second optical filter substrate separate and independent from the semiconductor substrate and from the first optical filter substrate and one or more second optical filter layers and wherein the second optical filter substrate is disposed on or over the semiconductor substrate and over the second optical transducer to optically filter the light to which the second optical transducer is responsive or to optically filter the light emitted by the second optical transducer.

12. A compound optical filter device, comprising:
   a semiconductor substrate;
   an optical transducer disposed in or on the semiconductor substrate, the optical transducer responsive to light to produce a signal or responsive to a signal to emit light; and
   an optical filter comprising an optical filter substrate separate and independent from the semiconductor substrate, wherein the optical filter comprises one or more optical filter layers disposed on the optical filter substrate or wherein the optical filter substrate is an optical filter;
   wherein the optical filter is micro-transfer printed on and in direct contact with or directly adhered to at least one of the semiconductor substrate and the optical transducer and over the optical transducer to optically filter the light to which the optical transducer is responsive or to optically filter the light emitted by the optical transducer.

13. The compound optical filter device of claim 12, comprising a layer of adhesive in direct contact with the optical filter and between the optical filter and the semiconductor substrate to adhere the optical filter to the semiconductor substrate.

14. The compound optical filter device of claim 12, wherein the optical filter comprises an encapsulation layer disposed at least partially on a side of the one or more optical filter layers opposite the optical filter substrate and at least partially on a side of the one or more optical filter layers that is substantially non-parallel to the surface of the semiconductor substrate on which the optical filter is micro-transfer printed.

15. The compound optical filter device of claim 14, wherein the encapsulation layer comprises at least a portion of a tether.

16. The compound optical filter device of claim 12, wherein the optical filter substrate comprises at least a portion of a tether.

17. The compound optical filter device of claim 12, wherein the optical transducer is a first optical transducer and the compound optical filter device comprises a second optical transducer disposed in or on the semiconductor substrate, the second optical transducer responsive to light to produce a signal or responsive to a signal to emit light.

18. The compound optical filter device of claim 17, wherein the first optical transducer is a light emitter responsive to a signal to emit light and the second optical transducer is a light sensor responsive to light to produce a signal.

19. The compound optical filter device of claim 18, wherein the compound optical filter device is a proximity sensor.

20. The compound optical filter device of claim 17, wherein the optical filter is a first optical filter, the optical filter substrate is a first optical filter substrate, the one or more optical filter layers are one or more first optical filter layers, and the compound optical filter device comprises a second optical filter comprising a second optical filter substrate separate and independent from the semiconductor substrate and from the first optical filter substrate and one or more second optical filter layers and wherein the second optical filter substrate is disposed on or over the semiconductor substrate and over the second optical transducer to optically filter the light to which the second optical transducer is responsive or to optically filter the light emitted by the second optical transducer.

\* \* \* \* \*